United States Patent [19]

Nguyen

[11] Patent Number: 5,508,666
[45] Date of Patent: Apr. 16, 1996

[54] RF FEEDTHROUGH

[75] Inventor: Dung T. Nguyen, Fountain Valley, Calif.

[73] Assignee: Hughes Aircraft Company, Los Angeles, Calif.

[21] Appl. No.: 345,270

[22] Filed: Nov. 28, 1994

Related U.S. Application Data

[63] Continuation of Ser. No. 151,452, Nov. 15, 1993, abandoned.

[51] Int. Cl.$^6$ ............................... H03H 7/38; H01P 1/04
[52] U.S. Cl. ........................... 333/33; 333/260; 333/246
[58] Field of Search ................................. 333/260, 246, 333/247, 238, 33, 34; 257/728, 664

[56] References Cited

U.S. PATENT DOCUMENTS

| | | | |
|---|---|---|---|
| 4,487,999 | 12/1984 | Baird et al. | 333/260 |
| 4,724,409 | 2/1988 | Lehman | 333/260 |
| 4,810,981 | 3/1989 | Herstein | 333/260 |

FOREIGN PATENT DOCUMENTS

| | | | |
|---|---|---|---|
| 0092102 | 6/1983 | Japan . | |
| 0221104 | 12/1984 | Japan . | |
| 0129701 | 6/1988 | Japan | 333/247 |
| 0451704 | 2/1992 | Japan | 333/260 |
| 4296103 | 10/1992 | Japan . | |

OTHER PUBLICATIONS

*Microwave Transmission Design Data,* Sperry Gyroscope Co. Great Neck, Long Island, N.Y. pp. 2–3 1954.

*Primary Examiner*—Benny Lee
*Assistant Examiner*—Darius Gambino
*Attorney, Agent, or Firm*—Leonard A. Alkov; W. K. Denson-Low

[57] ABSTRACT

The present invention provides an improved rf feedthrough connector having a first section (12) in which a inner conductor (18) is spaced from a co-axial outer conductive shield (16) by a cylindrical insulating dielectric layer (22). A second section (14) has a second inner conductor (28) which is electrically coupled to the first inner conductor (18). A second outer shield (34) is spaced from the second inner conductor by a semi-cylindrical insulating dielectric layer (30). The inner radius (R1) of the first outer shield (16) is different from the inner radius (R3) of the second outer shield (26). Given the properties of the material forming the first and second dielectric layers, (22) and (30), these radii are selected so as to provide a uniform impedance in both the first (12) and second (14) sections of the feedthrough connector (10).

21 Claims, 2 Drawing Sheets

RF FEEDTHROUGH

This is a continuation application Ser. No. 08/151,452, filed Nov. 15, 1993, now abandoned.

BACKGROUND OF THE INVENTION

1. Technical Field

This invention relates generally to electrical connectors and, more particularly, to a feedthrough connector for microwave integrated circuits.

2. Discussion

Microwave integrated circuits (MICs) often include a microstrip transmission line mounted on a conductive supporting substrate. The MIC is typically sealed within a hermetically sealed conductive package or housing and, therefore, the electrical connection from the MIC microstrip transmission line to another circuit component, such as a coaxial transmission line or another microstrip, must be made through a package wall.

Conventional rf feedthrough connectors used in this type of application typically have a cylindrically shaped outer conductor surrounding a co-axial inner conductive pin which is spaced from the outer conductor by a dielectric glass insulator. The outer conductor is sealed in an opening formed in a wall of the package housing and the center pin extends longitudinally into a package cavity. The MIC substrate is placed in the cavity and slid under the center pin. In order to electrically connect the pin to a microstrip transmission line on the substrate, a ribbon loop is made from the MIC microstrip line over the conductive pin.

However, connectors of this-type often possess several disadvantages which suggest the need for an alternative design. First, this type of conventional connector is not amenable to automated assembly procedures since the microstrip substrate must be slid underneath the protruding inner conductor. Accordingly, there is a danger of bending the extending inner conductor or creating a crack at the glass interface while sliding the substrate beneath the conductive pin, or while wirebonding the inner conductor to the MIC. The ribbon loop also tends to have a high inductance which undesirably increases the voltage standing wave ratio (VSWR).

Fabrication of a conventional feedthrough housing also tends to be expensive because it requires that individual components be held to tight tolerances in order to maintain a close clearance between the upper substrate surface and the underside of the inner conductor. Concentric holes of different diameters often need to be formed in the housing wall, one hole for the outer conductor and another through which the conductive pin protrudes. Solder typically used to seal the outer conductor in the housing wall opening can also flow into the hole through which the inner conductor extends into the package cavity, thereby creating the possibility of an electrical short.

U.S. Pat. No. 4,724,409 to Lehman, issued Feb. 9, 1988, attempts to provide an improvement over this type of conventional connector. This patent shows a connector having a cylindrical portion secured in an opening formed in a package wall and an adjoining semi-cylindrical portion which protrudes into the cavity in which the MIC or other circuit component is disposed. Upper portions of the outer conductor, dielectric insulating layer and inner conductor of the semi-cylindrical portion of the connector have been removed to form a planar upper surface on the portion of the connector which extends into the package cavity. The MIC is positioned within the cavity such that it abuts this semi-cylindrical portion and the exposed surface of the inner conductor is attached to a microstrip line on the MIC by a short ribbon or wire bond. Semi-cylindrical sections of the shield and dielectric layer support the inner conductor along its entire length from beneath.

However, the removal of upper portions of part of the connector to form a semi-cylindrical portion can cause the characteristic impedance of that portion of the connector to differ from that of the adjoining cylindrical portion. The resulting performance of the connector may be degraded by a nonuniform impedance along its length which can increase VSWR. This type of connector also has the disadvantage of requiring that the portion of the connector protruding into the cavity be machined to a length which ensures that it precisely abuts the MIC substrate, thereby increasing manufacturing difficulty and cost.

As such, it may be appreciated that there continues to be a need for a microwave feedthrough connector which provides reduced manufacturing cost and improved reliability through simplified connector construction, compatibility with automated assembly procedures and reduced VSWR.

SUMMARY OF THE INVENTION

The present invention provides an improved rf transition feedthrough connector having a first section in which a center conductor is spaced from a co-axial outer conductive shield by a substantially cylindrical insulating dielectric layer. An adjoining second section has a second inner conductor which is electrically coupled to the first inner conductor. A second outer shield is spaced from the second inner conductor by a semi-cylindrical insulating dielectric layer. The inner radii of the first and second outer conductive shields, however, are dissimilar and are each selected so as to provide a uniform characteristic impedance in both the first and second sections of the feedthrough connector.

The present connector thus provides reduced VSWR since it has a uniform impedance along its length and the typically high inductance ribbon loop is eliminated. Moreover, housing manufacture is simplified since only a single diameter bore is required for the feedthrough, and its depth is less critical than that required by more conventional feedthroughs. Also, the present feedthrough connector is reliable in that the protruding center conductor is adequately supported along its length and because it facilitates a connector package which does not possess narrow empty spaces which may be inadvertently filled with solder.

These and other advantages, along with the various features of novelty which characterize the invention, are pointed out with particularity in the claims annexed to and forming a part of this disclosure. For a better understanding of the invention, its operating advantages and the specific objects attained by its uses, reference should be had to the accompanying drawings and descriptive matter in which there is illustrated a preferred embodiment of the invention.

DETAILED DESCRIPTION OF THE INVENTION

Figure 1:
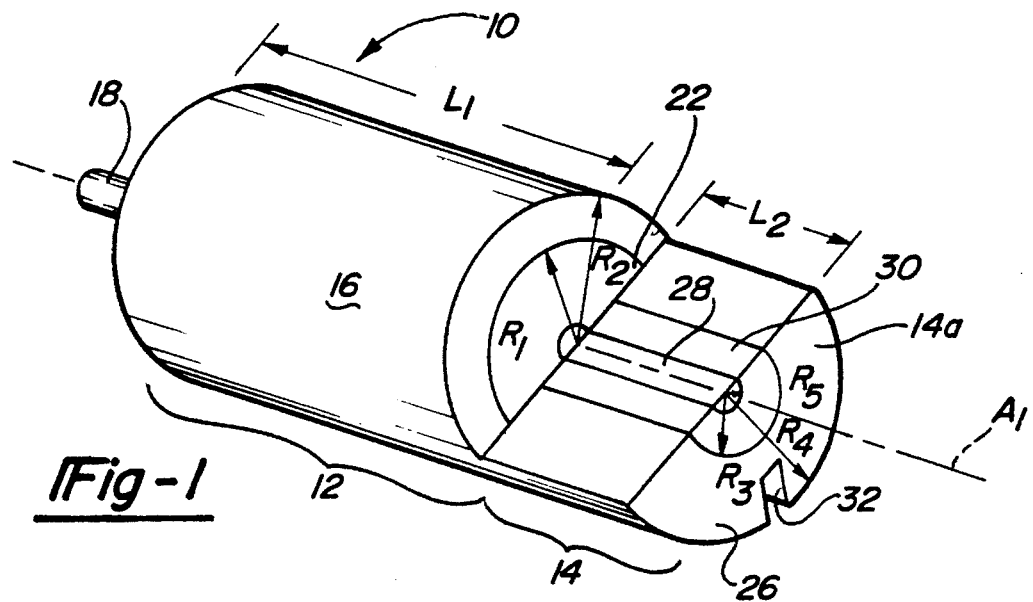
FIG. 1 is a perspective view of an rf feedthrough connector according to the teachings of the present invention.

With reference to FIG. 1, a first preferred embodiment of the feedthrough connector of the present invention is indicated generally at 10. Connector 10 has two adjoining sections, a first or closed section 12 and a second or modified geometry section 14. Closed section 12 includes a cylindrically-shaped conductive outer shield 16 having a length L1. Outer shield 16 is preferably constructed from a conductive metallic material, preferably brass plated with gold, and radially surrounds a first inner conductor 18, also preferably made of gold plated brass. A first dielectric insulating layer 22, preferably a glass, predeterminately spaces inner conductor 18 from outer shield 16.

With reference to a longitudinal axis A1, running generally through the center of connector 10, cylindrical outer shield 16 has an inner radius R1 and an outer radius R2. Given the properties of the material forming dielectric layer 22, the dimensions of the first inner conductor 18 and the radius R1 are preferably selected in a manner generally known to those having skill in the art to achieve a desired characteristic impedance, preferably to match the impedance of a coaxial transmission line or other electronic component which is to be electrically coupled to an MIC by feedthrough connector 10.

Modified geometry section 14 preferably includes a uniformly semi-cylindrical second conductive outer shield 26 having an inner radius R3 and an outer radius R4. Section 14 also includes a second inner conductor 28 having a radius R5, conductor 28 preferably extending the length L2 of the outer shield 26. An upper portion of the inner conductor 28 is preferably exposed in order to facilitate connection to a microstrip transmission line by soldering or wirebonding. The upper surface of the inner conductor 28 may also be flat as shown in FIG. 1, in order to provide a substantially planar exposed surface which improves wirebonding characteristics. In a preferred embodiment, outer shield 26 of modified geometry section 14 surrounds only the lower surface of the inner conductor 28 and is spaced therefrom by a dielectric insulating layer 30.

The components of modified geometry section 14 are preferably made of the same materials as those of first section 12. The first inner conductor 18 and second inner conductor 28 may have the same diameter and may be integrally formed as a single conductive member, or they may be formed separately and subsequently joined together. Similarly, the first outer shield 16 and the second outer shield 26 are preferably electrically coupled to one another and may be formed so as to have equal outer radii R2 and R4. Modified geometry section 14 may be originally formed as a closed cylindrical section with an upper portion of outer shield 26, inner conductor 28 and dielectric layer 30 removed, such as by grinding. However, section 14 may alternately be originally formed as a semi-cylindrical section and could be formed separately and then attached to closed section 12.

The materials forming dielectric layers 22 and 30 and the inner radii of outer shields 16 and 24 are selected to maintain a uniform impedance throughout the length of connector 10. FIG. 1 illustrates such an arrangement wherein first outer shield 16 and second outer shield 26 have different inner radii R3 and R5 respectively, chosen to create the same characteristic impedance in both closed section 12 and modified geometry section 14. This produces a connector having a reduced VSWR as compared to conventional connector designs. In a preferred embodiment of the present invention, wherein the glass material forming dielectric insulating layers 22 and 30 has a dielectric constant of approximately 5.7, the common radius of inner conductors 18 and 28 is approximately 0.25 mm, radius R1 is approximately 1.8 mm and radius R3 approximately 1.04 mm. This configuration forms a connector 10 having a uniform characteristic impedance of 50 ohms in both sections 12 and 14.

A keying slot 32 may also be provided in outer shield 26 of the connector 10 in order to facilitate alignment with an MIC substrate, via a mating feature such as a dowel pin formed or placed in an enclosing housing. The keying slot 32 dimensions are noncritical, however a slot depth should be chosen which is less than the thickness of the outer shield 26. Further, an end 14a of modified geometry section 14 should preferably be flat and lie in a plane normal to axis A1 in order to act as a positioning aid for the connector 10 with respect to the housing and MIC substrate.

Figure 2:
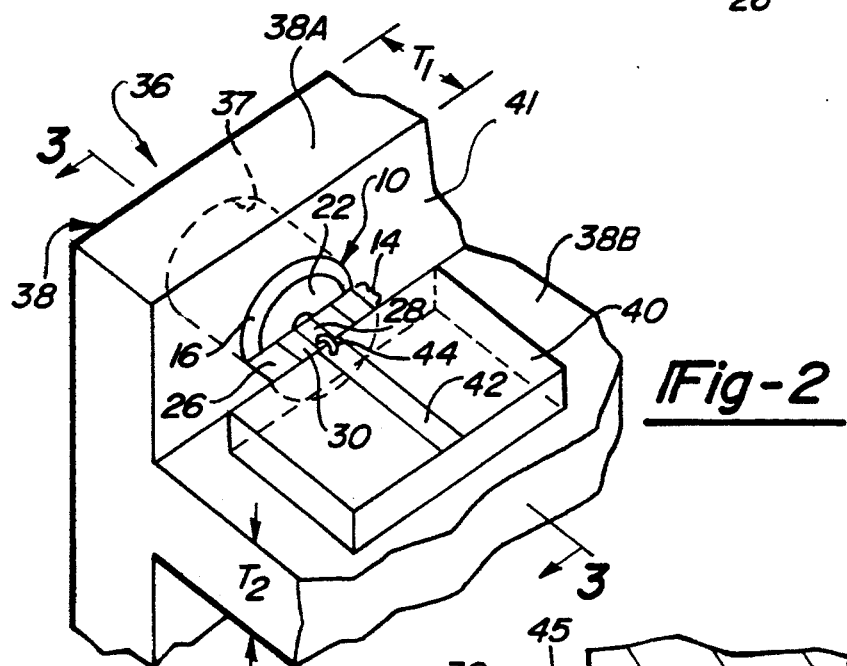
FIG. 2 is a perspective view of the feedthrough installed in a conductive housing and positioned for connection to a microstrip transmission line which has been mounted on a supporting substrate.
Figure 3:
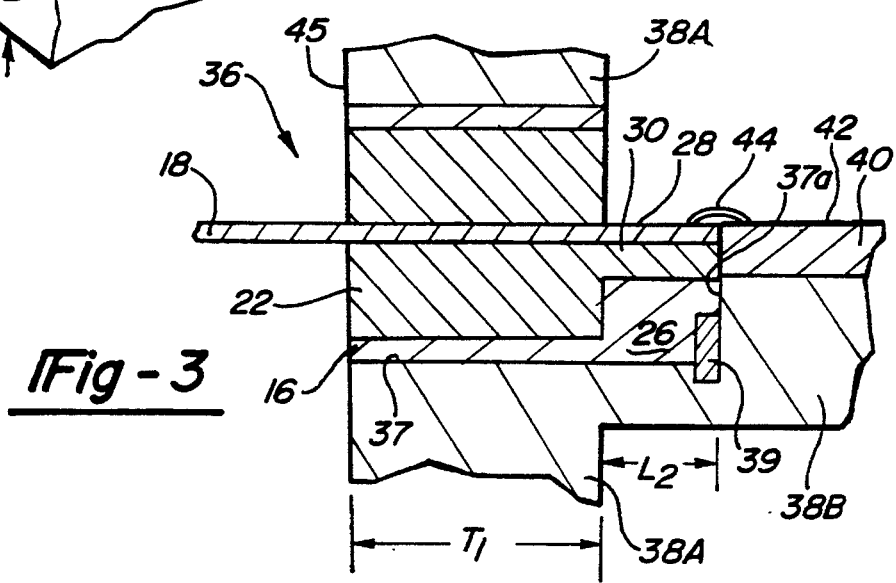
FIG. 3 is a cross-sectional view of the feedthrough and housing, taken generally along line 3—3 of FIG. 2.

Turning now to FIG. 2 and FIG. 3, connector 10 is shown as part of a package 36. Connector 10 is preferably inserted longitudinally into a hole 37 of suitable diameter which has been formed in a conductive package housing 38. Housing 38 is preferably made of a metal or other suitable conductive material and has a vertical member 38A having a thickness T1 and a horizontal member 38B having a thickness T2. The length L1 of feedthrough closed section 12 is preferably made to be greater than or equal to the housing wall thickness T1.

A bored hole 37 extends completely through vertical member 38A, preferably therepast into horizontal member 38B a distance approximately equal to L2. With reference to the upper side of the horizontal member 38B, the position of center of hole 37 is selected so that an upper surface of inner conductor 28 is substantially coplanar with a microstrip transmission line 42 disposed on an MIC substrate 40. This can result in the formation of a shallow channel in horizontal member 38B having a face 37a which serves as a locating feature for connector 10 upon insertion into hole 37. However, a channel will not be formed when substrate 40 is thicker than R4. A dowel pin 39 or other similar feature may be included to provide a proper orientation of connector 10 in housing 38 via engagement of keying slot 32, as well as to prevent rotation of connector 10 about axis A1.

Substrate 40 is preferably positioned adjacent to surface 14a of modified geometry section 14 of connector 10 such that inner conductor 28 contacts one side of the substrate 40. This obviates the requirement of some conventional designs which require that a suitable substrate locating feature be machined into the housing. Substrate 40 may be preferably dropped vertically into position adjacent connector 10 in order to facilitate automated assembly. Inner conductor 28 is then electrically coupled to a microstrip transmission line 42 disposed on substrate 40 by wirebonding a conductive ribbon or wire 44 therebetween. Outer shield 16 is preferably hermetically sealed within bored hole 37 in housing 38, such as by soldering.

This configuration allows the inner conductor 28 to be wirebonded or soldered to the microstrip transmission line 42 using a small short ribbon 44 rather than a loop. An upper surface of inner conductor 28 is preferably substantially coplanar with microstrip transmission line 42 to further reduce VSWR. The feedthrough assembly process is also improved by utilizing the dielectric layer 22 to provide support for the inner conductor 28 from underneath, thereby reducing the risk of bending or cracking the inner conductor 28.

Figure 4:
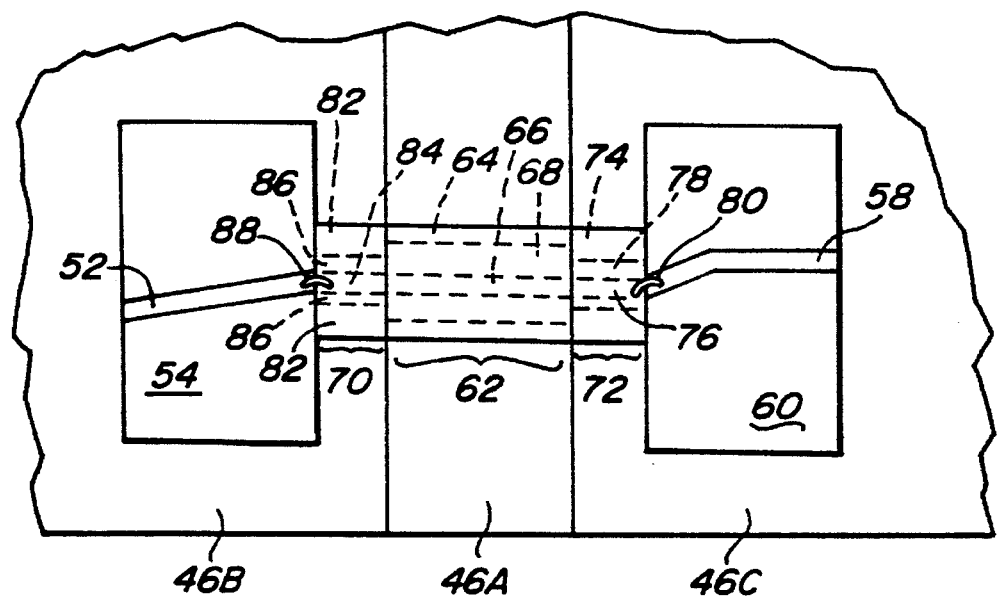
FIG. 4 is a plan view illustrating an alternate embodiment of the feedthrough of the present invention suitable for connecting two microstrip transmission lines through a package housing wall.
Figure 5:
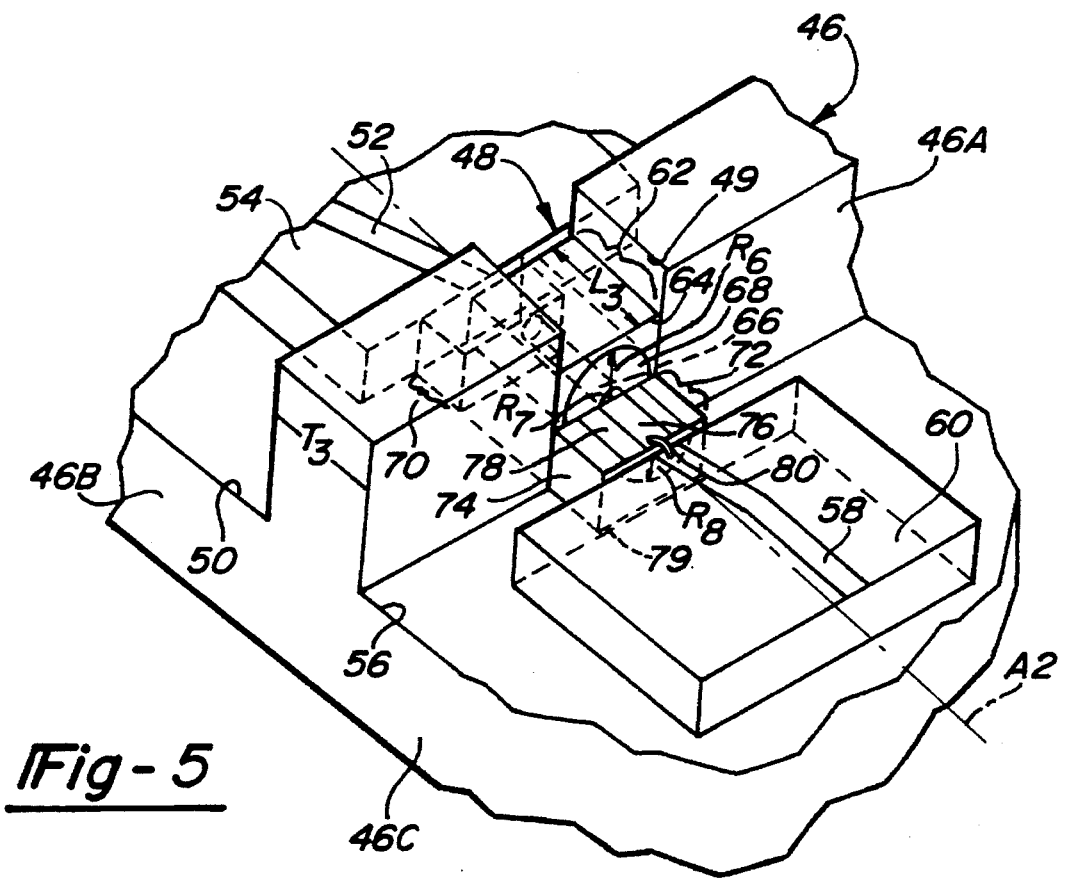
FIG. 5 is a perspective view of the alternate embodiment of the feedthrough of the present invention shown in FIG. 4.

In an alternate embodiment of the present invention, depicted in FIG. 4 and FIG. 5, the present transition feedthrough is utilized to electrically interconnect two microstrip transmission lines contained in separate cavities separated by an isolating package wall. In this second embodiment, the outer shields are rectangular and a second modified geometry section is added to the closed section, on a side thereof opposite the first modified geometry portion. The rectangular shapes of the outer conductive shields further simplify manufacturing by eliminating the necessity of machining a round hole through the isolating wall.

As shown in FIG. 4 and FIG. 5, a conductive housing 46 includes a vertical member 46A, a first horizontal member 46B and a second horizontal member 46C. The feedthrough connector 48 is preferably installed into housing 46 by dropping the connector 48 vertically into a rectangular gap 49 formed in vertical member 46A. The vertical member 46A has a thickness T3 and separates a first cavity 50, containing a first microstrip transmission line 52 mounted on a supporting substrate 54, from a second cavity 56 containing a second microstrip transmission line 58, mounted on a substrate 60.

Connector 48 includes a closed section 62 having a length L3 substantially equal to the thickness T3 of housing vertical member 46A. Closed section 62 includes a conductive outer shield 64, an inner conductor 66 and an insulating dielectric layer 68. With reference to a longitudinal axis A2, outer shield 64 is substantially rectangular but having an inner radius R6. The outer shield 64 surrounds a longitudinally disposed inner conductor 66 of radius R7 extending throughout length L3 of closed section 62 and is spaced therefrom by the dielectric layer 68. The design of the closed section 62 is analogous to that of the closed section 12 of the first embodiment wherein, given the properties of the material forming dielectric layer 68, the radii R6 and R7 are chosen to provide a particular impedance, preferably to match the impedance of a connected transmission line.

Connector 48 includes a pair of sections of modified geometry, first modified geometry section 70 and a second modified geometry section 72, wherein the rectangular outer shapes have been substituted for the semi-cylindrical shape of the first embodiment. The second modified geometry section 72 has a conductive outer shield 74 which surrounds an inner conductor 76 and is spaced therefrom by a semi-cylindrical insulating dielectric layer 78. Outer shield 74 is substantially rectangular with an inner radius R8. The upper surface of the inner conductor 76 is preferably exposed and preferably has a planar upper surface to improve wirebonding characteristics. Inner conductor 76 is positioned adjacent to microstrip transmission line 58 and a wire or ribbon 80 is bonded from the inner conductor 76 to the microstrip line 58 to effect an electrical connection therebetween.

Modified geometry section 70, as shown best in FIG. 5, includes a conductive outer shield 82. Outer shield 82 surrounds a longitudinally disposed inner conductor 84 which extends along the length of the modified geometry section 70 and is separated therefrom by an insulating dielectric layer 86. The substrate 54 is placed adjacent to the end of inner conductor 84 and a wire or ribbon 88 is bonded from the inner conductor 84 to the microstrip transmission line 52. As with the previous embodiment, the dimensions and materials of closed section 62 and both sections of modified geometry, 70 and 72, are preferably chosen so as to provide a uniform characteristic impedance through all three sections.

As described above, an improved rf feedthrough connector is provided by varying the inner dimensions between sections of the feedthrough, producing a substantially uniform characteristic impedance throughout the length of the feedthrough, and thereby improving performance by reducing VSWR. In addition, the feedthrough connector is adaptable to several configurations, such as for connecting a microstrip line to a coaxial cable or to another microstrip and simplifies housing design. The present transition feedthrough further allows automated assembly of microwave substrates into a housing as well as automated assembly of the connector into the housing.

The foregoing discussion discloses and describes merely exemplary embodiments of the present invention. One skilled in the art will readily recognize from such discussion, and from the accompanying drawings and claims, that various changes and modifications can be made therein without departing from the spirit and scope of the invention as defined in the following claims.

I claim:

1. A microwave transition feedthrough for electrically connecting a microwave integrated circuit (MIC) microstrip transmission line to another electronic component comprising:

a first section having:
 a first inner conductor;
 a first surrounding conductive shield, said first shield having a first inner radius; and
 a first insulating dielectric layer, said first dielectric layer being substantially cylindrical in shape and disposed intermediate said first inner conductor and said first surrounding conductive shield so as to predeterminately space said first inner conductor from said first shield; and a second section having:
 a second inner conductor electrically coupled to said first inner conductor;
 a second conductive shield with a substantially semi-cylindrical inner surface, said second shield having a second inner radius that is different from said first inner radius of said first conductive shield; and
 a second dielectric layer, said second dielectric layer being substantially semi-cylindrical and disposed so as to space said second inner conductor from said second conductive shield, wherein the first inner radius of said first shield and second inner radius of said second shield are selected so that said first section has a first characteristic impedance and said second section has a second characteristic impedance that is substantially equal to the first characteristic impedance of said first section.

2. The feedthrough of claim 1 wherein said second inner conductor is cylindrical.

3. The feedthrough of claim 1 wherein said second inner conductor is semi-cylindrical.

4. The feedthrough of claim 1 wherein said first and second sections are substantially rectangular.

5. The feedthrough of claim 1 wherein said first section is substantially cylindrical and said second section is substantially semi-cylindrical.

6. The feedthrough of claim 1 further comprising a third section, said third section adjoining said first section and having:
- a third inner conductor electrically coupled to said first inner conductor;
- a third conductive shield, said third shield having a third inner radius different from said first inner radius of said first conductive shield; and
- a third insulating dielectric layer, said third dielectric layer being substantially semi-cylindrical and disposed so as to space said third inner conductor from said third conductive shield.

7. The feedthrough of claim 6 wherein said first section has a first characteristic impedance, said second section has a second characteristic impedance and said third section has a third characteristic impedance, and the first, second and third inner radii are selected so that said first, second and third characteristic impedances are substantially equal.

8. A package for a microwave integrated circuit (MIC), said MIC having a microstrip transmission line disposed upon a supporting substrate, comprising:
- a conductive housing having at least one cavity formed therein, said MIC disposed in said cavity, said cavity having at least one wall, said wall having an aperture formed therein;
- a feedthrough connector for electrically connecting said MIC microstrip transmission line to another circuit component through said wall, said feedthrough connector including:
  - a first section having:
    - a first inner conductor;
    - a first surrounding conductive shield, said first shield disposed in said aperture and having a first inner radius and a first outer radius; and
    - a first insulating dielectric layer, said first dielectric layer being substantially cylindrical in shape and disposed intermediate said first inner conductor and said first shield so as to space said first inner conductor from said first shield; and
  - a second section disposed in said cavity having:
    - a second inner conductor electrically coupled to said first inner conductor;
    - a second conductive shield, said second shield having a second inner radius and a second outer radius, said second inner radius being different from said first inner radius of said first conductive shield, and the first outer radius being substantially similar to the second outer radius; and
    - a second dielectric layer, said second dielectric layer being substantially semi-cylindrical and disposed so as to space said second inner conductor from said second conductive shield,
  - wherein the first inner radius of said first conductive shield and the second inner radius of said second conductive shield are selected so that said first section has a first characteristic impedance and said second section has a second characteristic impedance substantially equal to the first characteristic impedance of said first section.

9. The package of claim 8 further comprising means for electrically connecting said second inner conductor to said microstrip transmission line.

10. The package of claim 9 wherein said means for electrically connecting is a conductive ribbon.

11. The package of claim 8 wherein said housing has a second cavity formed therein on a side of said wall opposite said first cavity and wherein said second cavity has disposed therein a second MIC having a second microstrip transmission line disposed upon a second supporting substrate, said feedthrough connector further comprising:
- a third section disposed in said second cavity having:
  - a third inner conductor electrically coupled to said first inner conductor;
  - a third conductive outer shield, said third shield having a third inner radius different from said inner radius of said first shield; and
  - a third dielectric insulating layer, said third dielectric layer being substantially semi-cylindrical and disposed so as to space said third inner conductor from said third conductive shield.

12. The package of claim 11 further comprising means for electrically connecting said third inner conductor to said second microstrip transmission line.

13. The package of claim 12 wherein said first section has a first characteristic impedance, said second section has a second characteristic impedance and said third section has a third characteristic impedance, and the first, second and third inner radii are selected so that said first second and third characteristic impedances are substantially equal.

14. A method for making a microwave transition feedthrough for electrically connecting a microwave integrated circuit (MIC) microstrip transmission line to another electronic component comprising the steps of:
- forming a first section having a first characteristic impedance by:
  - providing a first inner conductor;
  - providing a first conductive shield having a first inner radius radially surrounding said first inner conductor; and
  - providing a first dielectric insulating layer between said first inner conductor and said first conductive shield, said first dielectric layer being substantially cylindrical;
- forming a second section having a second characteristic impedance by:
  - providing a second inner conductor;
  - electrically coupling said second inner conductor to said first inner conductor;
  - providing a second surrounding conductive shield having a second inner radius; and
  - providing a second dielectric layer intermediate said second inner conductor and said second outer shield, said second dielectric layer being substantially semi-cylindrical; and
- selecting said first inner radius and said second inner radius to provide said first section with the first characteristic impedance substantially equal to the second characteristic impedance of said second section.

15. The method of claim 14 wherein said second section is formed by removing an upper portion of said second inner conductor, said second dielectric layer and said second outer shield.

16. The method of claim 14 further comprising the steps of:
- providing a housing having a cavity formed therein and having at least one wall;
- disposing said MIC in said cavity;
- forming an aperture in said wall;
- sealing said first section in said aperture such that said second section extends into said cavity; and
- electrically connecting said second inner conductor to said MIC microstrip transmission line.

17. The method of claim 16 further comprising the steps of:
  providing a housing horizontal member disposed substantially perpendicularly to said wall, said horizontal member being adapted to support said MIC thereupon; and
  forming said aperture through said wall into said horizontal member, said aperture placed such that a lower surface of said second section rests in said aperture in said horizontal member.

18. The method of claim 17 wherein said MIC is dropped vertically downward into said cavity, into a position such that said MIC abuts said second end of said feedthrough.

19. The method of claim 13 wherein said feedthrough is dropped vertically into said housing wall opening.

20. The feedthrough of claim 1 wherein said second section further comprises a slot formed in the second conductive shield for receiving a mating member so as to facilitate alignment of the MIC microstrip transmission line with another electronic component.

21. The feedthrough of claim 1 wherein said first conductive shield has a cylindrical outer surface with a first outer radius and said second conductive shield has a substantially semi-cylindrical outer surface with a second outer radius, said first and second outer radii being substantially equal.

* * * * *